United States Patent [19]

Hutson

[11] 4,011,579

[45] Mar. 8, 1977

[54] SEMICONDUCTOR GATE TURN-OFF DEVICE

[76] Inventor: Jearld L. Hutson, P.O. Box 34235, Dallas, Tex. 75234

[22] Filed: Apr. 7, 1975

[21] Appl. No.: 565,965

[52] U.S. Cl. .............................. 357/38; 307/252 C; 357/37; 357/89
[51] Int. Cl.² ..................................... H01L 29/743
[58] Field of Search ................ 357/37, 38, 39; 307/252 C

[56] References Cited
UNITED STATES PATENTS

| | | | |
|---|---|---|---|
| 3,165,710 | 1/1965 | Strull | 357/38 |
| 3,251,004 | 5/1966 | Shombert et al. | 357/38 |
| 3,256,470 | 6/1966 | Gerlach | 357/38 |
| 3,337,783 | 8/1967 | Stehney | 357/38 |
| 3,401,320 | 9/1968 | Weinstein | 357/38 |
| 3,427,512 | 2/1969 | Mapother | 357/38 |
| 3,465,216 | 9/1969 | Teszner | 357/38 |
| 3,538,401 | 11/1970 | Chu | 357/38 |

*Primary Examiner*—William D. Larkins

[57] ABSTRACT

The specification discloses a semiconductor switching device which includes heavily doped exterior layers of semiconductor material to provide rapid turn-on and turn-off actions in response to gate signals, while substantially reducing susceptibility to secondary breakdown and the occurrence of significant voltages across the device during a high conductivity mode. A preferred embodiment includes a six layer semiconductor device having a heavily doped P+ exterior layer in contact with an electrode to form an anode terminal, and a heavily doped N+ exterior layer in contact with an electrode to form a cathode terminal. A gate electrode is formed in contact with an intermediate N-type layer adjacent the anode to provide a gate terminal.

6 Claims, 2 Drawing Figures

SEMICONDUCTOR GATE TURN-OFF DEVICE

FIELD OF THE INVENTION

This invention relates to multilayered semiconductor switching devices, and more particularly to a semiconductor gate turn-off switch having rapid turn-on and turn-off times and stable switching states.

THE PRIOR ART

Four layer semiconductor devices including the silicon controlled rectifier (SCR), the silicon controlled switch (SCS), the gate turn-off switch (GTO), and the four-layer diode are well-known. The typical SCR is a silicon semiconductor device which will conduct current in only one direction when triggered by injecting current into a gate lead. Once the gate has triggered the SCR into the high conduction mode, however, it no longer has any control over the device. One method of turning off the SCR is to reduce the main current below a level required to hold the device in the high conduction mode. To turn off the SCR in a minimum time, however, it is necessary to apply a reverse voltage to the device. The recovery of the SCR by either method of turn-off is not complete until the center junction of the device is substantially cleared of the high concentration of holes and electrons accumulated during the high conductivity mode. The time delay required to sufficiently decrease the concentration depends primarily on the recombination process which is quite independent of external applied voltage.

A device similar to the SCR is the gate turn-off switch (GTO) which has special gate construction characteristics that enable a small reverse gate current to turn-off the load current of the device. The GTO can also be turned off in the same manner as the SCR. Typically, the GTO has a faster turn-off action than the SCR and may be used in systems requiring higher power and load voltages than can be sustained by an SCR.

Prior GTO switches are normally characterized by substantial voltages while in the highly conductive state as a result of the low current gains which are required to turn the device off, and are further subject to secondary breakdown under a turn-off mode. Secondary breakdown is associated with imperfections in the device structure, usually being more severe in multiple-diffused, high-speed devices.

The present invention provides a GTO having rapid turn-on and turn-off action, and less susceptibility to secondary breakdown in the turn-off mode and high voltage effects in the highly conductive mode.

SUMMARY OF THE INVENTION

In accordance with the present invention, a gate turn-off switch includes a semiconductor body having seven layers of alternating conductivity types and heavily doped outer layers. More particularly, the semiconductor body of the switching device comprises seven layers of alternating conductivity types, with a central layer and one exterior layer of a first conductivity type and a second exterior layer of a second conductivity type. Electrodes are formed in contact with the exterior layers to form an anode and a cathode terminal. In addition, an electrode ring encircling the anode terminal is formed in contact with an intermediate layer to provide a gating terminal. The device may be turned on and off by injecting a forward and reversing current, respectively, into the gating terminal. Rapid turn-on and turn-off actions are exhibited with a reduced probability of secondary breakdown in a turn-off mode and high voltage effects during a highly conductive mode.

In one aspect of the invention, a second gate electrode is formed in contact with an intermediate layer, which in turn is connected through a resistor to the cathode of the device. Access thus is provided to more than one device junction to more quickly stop the normal internal regeneration which precedes a turn-off action.

DESCRIPTION OF THE DRAWINGS

For a more complete understanding of the present invention and for further objects and advantages thereof, reference may now be had to the following description taken in conjunction with the accompanying drawings in which.

DESCRIPTION OF THE PREFERRED EMBODIMENT

Figure 1:
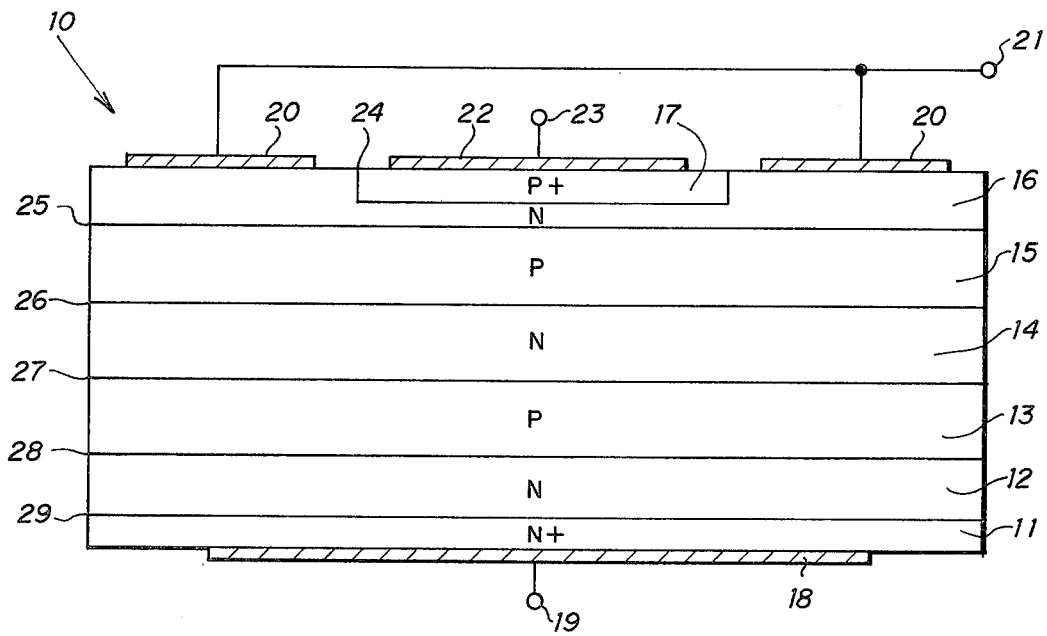
FIG. 1 is a diagrammatic side view of a gated turn-off device embodying the present invention.

Referring to FIG. 1, there is illustrated a gate turn-off switch including a semiconductor body generally indicated by reference number 10. Semiconductor body 10 is formed from six layers of semiconductor material having alternate conductivity types. More particularly, one layer includes an exterior layer 11 of heavily doped N+ material formed on the upper surface thereof to an intermediate N-type layer 12. Interposed between a central N-type layer 14 and N-type layer 12 is an intermediate P-type layer 13. A second P-type intermediate layer 15 is formed on the upper surface of central layer 14, while an intermediate N-type layer 16 is formed on the upper surface of layer 15. Diffused or otherwise formed into layer 16 and forming a second exterior layer of body 10 is a heavily doped P+ layer 17. Layer 16 is sufficiently highly doped to provide a very low resistivity to enable control of the layer with suitable bias. The N layer 16 thus enables the interior N layer under the P+ layer to be controlled, unlike prior GTO devices wherein the high resistivity N layers are not able to be easily controlled.

An electrode 18 is formed in contact with exterior layer 11 and is connected to a cathode terminal 19. An electrode ring 20 formed in contact with intermediate layer 16 is connected to a gate terminal 21. In addition, an electrode 22 is formed in contact with P+ layer 17 and is connected to an anode terminal 23. Although the device is illustrated with a ring gate configuration, it will be understood that the device could be constructed as an interdigitated structure.

As illustrated in FIG. 1, the GTO device of the present invention differs from conventional GTO configurations in that, among things, six (counting layers 11 and 12 as one layer), rather than four semiconductor layers form the device, and electrode ring 20 is in contact with an intermediate layer adjacent to an exterior layer 17 comprising the anode rather than adjacent to a cathode layer as in the conventional devices.

In operation, with anode terminal 23 positive relative to cathode terminal 19, junctions 24, 26 and 28 become forward biased while junctions 25 and 27 become reverse biased to form blocking junctions characteristic of GTO devices. When a voltage positive relative to terminal 19 but less positive than that applied to terminal 23 is applied to gate terminal 21, carriers are injected into intermediate layer 16 to initiate a regeneration process within body 10 to transition junctions 25 and 27 from a blocking condition into avalanche condition.

When a turn-off mode is desired, a positive voltage relative to anode terminal 23 is applied to gate terminal 21. As a result, the regeneration process occurring at junction 25 is terminated, and hence by a domino effect the regeneration process at junction 27 is also terminated. It has been found that the presence of low resistivity due to the high doping concentration in exterior layer 17 facilitates the turning off of the regeneration process occurring at junction 25. Thus, the emitter of the device, layer 17, is effectively removed by the reverse current injected into intermediate layer 16 by way of electrode 20 acting in combination with the low resistivity of the P+ layer 17. The N+ layer 11 improves the $V_f$ of the device by allowing the N layer 12 to be lightly doped.

Figure 2:
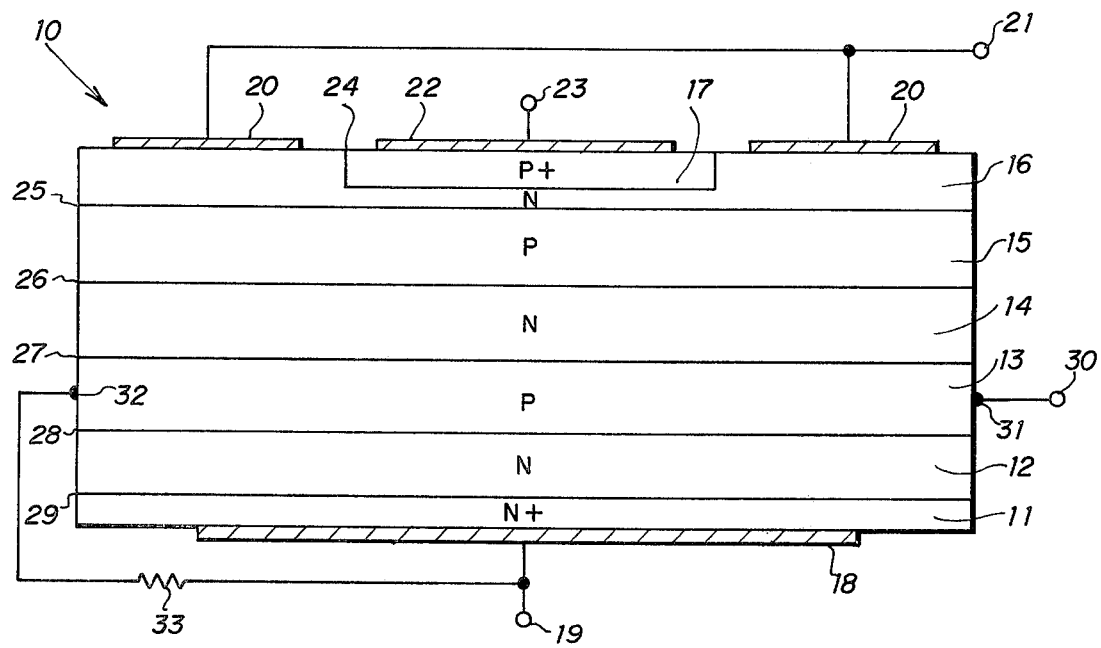
FIG. 2 is a diagrammatic side view of the device of FIG. 1, further having a second gate terminal formed in contact with an intermediate layer externally connected through a resistor to the cathode of the device.

A second embodiment of the present invention is illustrated in FIG. 2, wherein like reference numbers correspond to like component parts of the devices of FIG. 1. A second gate terminal 30 is connected through an ohmic contact 31 to intermediate layer 13. Layer 13 in turn is connected through ohmic contact 32 and a resistor 33 to the cathode terminal 19.

In operation, the highly conductive mode is achieved in the same manner as described with the device in FIG. 1. The turn-on mode can also be achieved with gate terminal 30 being positive with respect to cathode 19. The turn-off mode is acquired by applying voltage to gate terminal 21 which is positive relative to terminal 23 or by applying voltage to gate terminal 30 which is negative with respect to cathode 19. Thus, not only the regenerative process at junction 25 but also the regenerative process at junction 27 may be terminated to place the switching device more effectively into the forward blocking state. The contact 32 and resistor 33 operate to assist in the turn-off of the regenerative process at junction 27 by stabilizing the device by a "shorted emitter effect".

It is to be understood that still further gate terminal configurations may be used to more effectively control the forward blocking junctions of a switching device. For example, lead terminals may be formed in contact with layers 14 and 15 to act in combination with gate terminals 21 and 30 in controlling the junction 25 and junction 27 activity. The present device may also be constructed in a lateral configuration with all the electrodes connected on one side of the device.

Whereas the present invention has been described with respect to specific embodiments thereof, it will be understood that various changes and modifications will be suggested to one skilled in the art, and it is intended to encompass such changes and modifications as fall within the scope of the appended claims.

What is claimed is:

1. A gate turn-off device comprising:
   a semiconductor body including at least six layers of alternating first and second conductivity types of semiconductor material to form a plurality of interior rectifying junctions,
   a first exterior layer of said body formed from a first conductivity type material more heavily doped than the remaining layers of said first conductivity type in order to provide a low resistivity emitter, said first exterior layer covering only a portion of the exterior surface of said body and disposed in contact with a first intermediate layer of said second conductivity type material having a portion extending to the remaining portion of the exterior surface of said body,
   a second exterior layer of said body formed from said second conductivity type material having a high doping level in contact with a second intermediate layer of said second conductivity type material having a lower doping level,
   a gate electrode formed in contact with said first intermediate layer,
   a second electrode formed in contact with said first exterior layer, and
   a third electrode formed in contact with said second exterior layer,
   said device operable to be biased into a regenerative process to transition said interior rectifying junctions from blocking conditions into avalanche conditions,
   means for applying a gating signal to said gate electrode to provide fast turn-off characteristics by terminating said regenerative process, the termination of said regenerative process being facilitated by the effective removal of said first exterior layer emitter during turn-off due to the low resistivity of said emitter which causes reverse current to be injected into said first intermediate layer during switching.

2. The gate turn-off device of claim 1 and further comprising:
   a second gate terminal including conduction means connected to an intermediate layer.

3. The gate turn-off device of claim 2 and further comprising:
   conductive means placed in contact with said intermediate layer and said cathode electrode.

4. The gate turn-off device of claim 1 wherein said first intermediate, layer is provided with a low resistivity to enable control of said first intermediate layer in the region of said first exterior layer.

5. The gate turn-off device of claim 1 wherein said first conductivity type comprises P-type and said second conductivity type comprises N-type.

6. The gate turn-off device of claim 1 wherein said first exterior layer is centrally located and is bounded by areas of said first intermediate layer.

* * * * *